United States Patent
Yen (10) Patent No.: US 10,547,185 B2
(45) Date of Patent: Jan. 28, 2020

(54) BATTERY DEVICE, ELECTRONIC DEVICE AND METHOD FOR PROTECTING A BATTERY DEVICE

(71) Applicant: Quanta Computer Inc., Taoyuan (TW)

(72) Inventor: Wei-Ting Yen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 290 days.

(21) Appl. No.: 15/340,864

(22) Filed: Nov. 1, 2016

(65) Prior Publication Data

US 2018/0069410 A1 Mar. 8, 2018

(30) Foreign Application Priority Data

Sep. 2, 2016 (TW) .............................. 105128367 A (51) Int. Cl.
*H02J 7/00* (2006.01)
*H01M 10/42* (2006.01)
(Continued)

(52) U.S. Cl.
CPC ........ *H02J 7/0029* (2013.01); *G01R 31/3648* (2013.01); *H01M 10/4257* (2013.01); *H02J 7/0047* (2013.01); *H02J 7/0052* (2013.01); *G01R 31/3842* (2019.01); *G01R 31/396* (2019.01); *H01M 10/48* (2013.01);
(Continued)

(58) Field of Classification Search
USPC ......................................................... 320/134
See application file for complete search history.

(56) References Cited

U.S. PATENT DOCUMENTS 7,560,901 B2    7/2009  Fujikawa et al.
2006/0186859 A1*  8/2006  Fujikawa ............ G01R 31/025
                                                320/134
(Continued)

FOREIGN PATENT DOCUMENTS

EP      2 073 031 A2    6/2009
JP      2006-258797 A   9/2006
(Continued)

OTHER PUBLICATIONS

European Search Report dated Feb. 17, 2017, issued in application No. 16205783.0-1373.
(Continued)

*Primary Examiner* — Robert Grant
(74) *Attorney, Agent, or Firm* — McClure, Qualey & Rodack, LLP (57) ABSTRACT

A battery device includes at least a battery cell, a management chip and a bus. The management chip is coupled to the battery cell for detecting voltage or remaining capacity of the battery cell and managing an operation state of the battery device according to the voltage or the remaining capacity of the battery cell. The bus is coupled to the management chip. The management chip communicates with a host device via the bus. The management chip further determines whether the remaining capacity of the battery cell is not increasing while in a charging state. When the remaining capacity of the battery cell is not increasing while in the charging state, the management chip activates a protection mechanism to make the battery device exit the charging state.

10 Claims, 7 Drawing Sheets

(51) Int. Cl.
  *G01R 31/36* (2019.01)
  *H01M 10/48* (2006.01)
  *G01R 31/396* (2019.01)
  *G01R 31/3842* (2019.01)

(52) U.S. Cl.
  CPC ............... *H01M 2010/4271* (2013.01); *H01M 2010/4278* (2013.01); *H02J 7/0031* (2013.01); *H02J 7/0085* (2013.01); *H02J 2007/005* (2013.01); *H02J 2007/0098* (2013.01)

(56) References Cited

U.S. PATENT DOCUMENTS

| | | | |
|---|---|---|---|
| 2009/0128159 A1 | 5/2009 | Nakasuji | |
| 2011/0298417 A1 | 12/2011 | Stewart et al. | |
| 2012/0297211 A1 | 11/2012 | Lee | |
| 2013/0285605 A1* | 10/2013 | Partovi | H02J 7/0042 320/108 |

FOREIGN PATENT DOCUMENTS

| | | |
|---|---|---|
| JP | 2007-328943 A | 12/2007 |
| JP | 2010-028876 A | 2/2010 |
| JP | 2016-119751 A | 6/2016 |
| KR | 2012-0128895 A | 11/2012 |
| KR | 2015-0043842 A | 4/2015 |
| TW | 201427230 A | 7/2014 |
| WO | 2007142195 A1 | 12/2007 |
| WO | 2011/110761 A1 | 9/2011 |

OTHER PUBLICATIONS

Japanese language office action dated Mar. 27, 2018, issued in application No. JP 2017-128495.
Japanese language office action dated Jul. 10, 2018, issued in application No. 2017-128495.
Korean language Office Action dated Jan. 2, 2018.
Chinese language office action dated Mar. 3, 2017, issued in application No. TW 105128367.

* cited by examiner

BATTERY DEVICE, ELECTRONIC DEVICE AND METHOD FOR PROTECTING A BATTERY DEVICE

CROSS REFERENCE TO RELATED APPLICATIONS

This Application claims priority of Taiwan Patent Application No. 105128367, filed on Sep. 2, 2016, the entirety of which is incorporated by reference herein.

BACKGROUND OF THE INVENTION

Field of the Invention

The invention relates to a method for protecting a battery device, and more particularly to a method for protecting a battery device when a charging abnormality has occurred.

Description of the Related Art

Electronic apparatuses that cannot be continuously coupled to stationary power sources may instead employ localized sources of energy like batteries. The growing popularity of mobile apparatuses for use in communication, productivity, entertainment, etc. is an obvious example of how electronic devices may utilize batteries in order to provide mobility. Batteries may be disposable or rechargeable. Rechargeable solutions are currently being focused on for technological development, and this has led to the wide implementation of rechargeable batteries in various areas.

However, heat is produced during both the charge and discharge procedures. Therefore, battery manufacturers and electronic product manufacturers have made a great effort to design charge and discharge protection mechanisms for battery devices, and to perfect these protection mechanisms and prevent them from high power consumption and overheating, which could be dangerous for users.

BRIEF SUMMARY OF THE INVENTION

A battery device, an electronic device and a method for protecting a battery device are provided. An exemplary embodiment of a battery device comprises at least a battery cell, a management chip and a bus. The management chip is coupled to the battery cell for detecting a voltage or a remaining capacity of the battery cell and managing an operation state of the battery device according to the voltage or the remaining capacity of the battery cell. The bus is coupled to the management chip. The management chip communicates with a host device via the bus. The management chip further determines whether the remaining capacity of the battery cell is not increasing while in a charging state. When the remaining capacity of the battery cell is not increasing while in the charging state, the management chip activates a protection mechanism to make the battery device exit the charging state.

An exemplary embodiment of an electronic device comprises a battery device, a charging-discharging chip and a micro-processor. The charging-discharging chip is coupled to the battery device for controlling a charging operation and a discharging operation of the battery device. The micro-processor communicates with the battery device via a bus. When the micro-processor determines that a remaining capacity of the battery device is not increasing while in a charging state, the micro-processor activates a protection mechanism to make the battery device exit the charging state.

An exemplary embodiment of a method for protecting a battery device comprises: determining whether a battery device operates in a charging state; when the battery device operates in the charging state, determining whether a remaining capacity of the battery device is not increasing while in the charging state; and when the remaining capacity of the battery device is not increasing while in the charging state, activating a protection mechanism to make the battery device exit the charging state.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
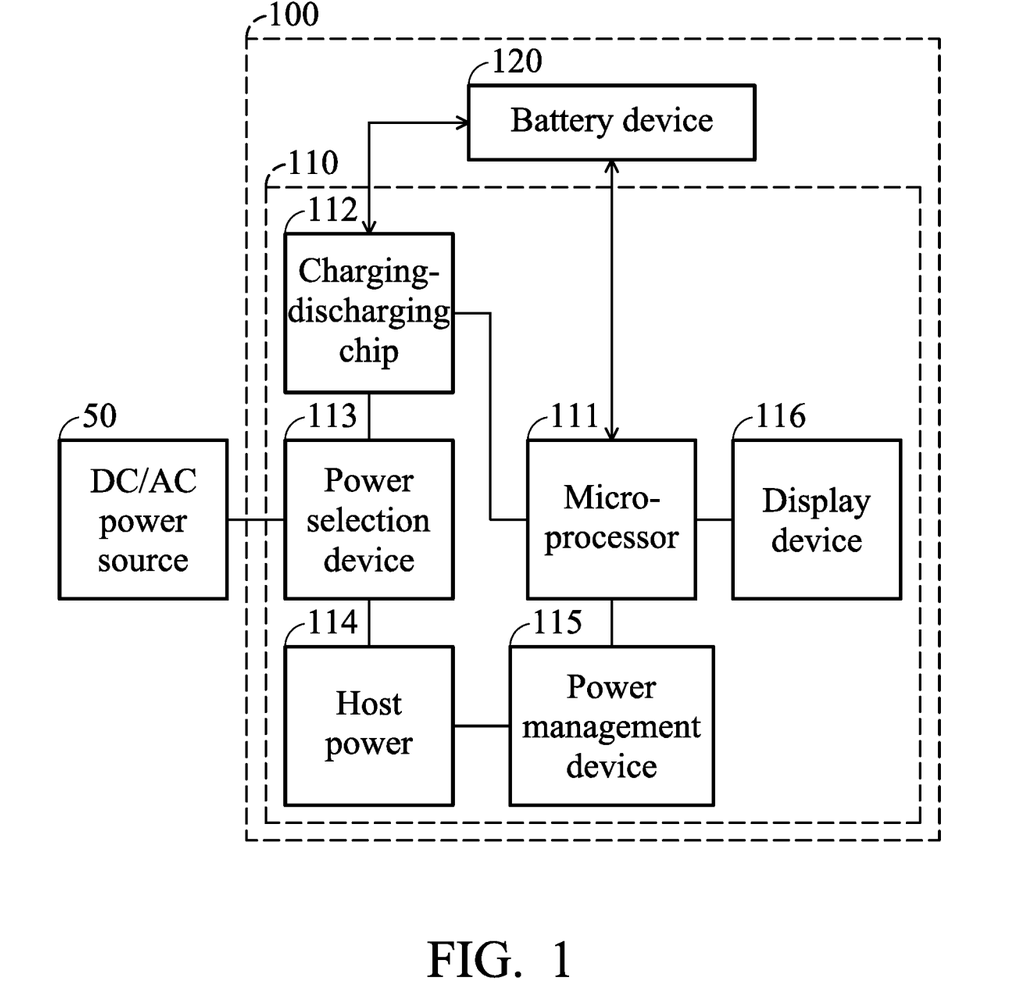
FIG. 1 is a block diagram of an electronic device according to an embodiment of the invention.

FIG. 1 is a block diagram of an electronic device according to an embodiment of the invention. The electronic device 100 may comprise a host device 110 and a battery device 120. The battery device 120 may be a rechargeable battery device provided as one of the power sources of the electronic device 100.

The host device 110 may at least comprise a micro-processor 111, a charging-discharging chip 112, a power selection device 113, a host power 114, a power management device 115 and a display device 116.

Note that in order to clarify the concept of the invention, FIG. 1 presents a simplified block diagram, in which only the elements relevant to the invention are shown. It will be readily appreciated by persons with ordinary skill in the art that the electronic device can certainly comprise other elements to provide specific functions, and thus the invention is not limited to what is shown in FIG. 1.

The charging-discharging chip 112 is coupled to the battery device 120 for controlling the charging operation and the discharging operation of the battery device 120. The charging-discharging chip 112 provides the discharging and charging circuits, respectively for receiving power from the battery device 120 during a discharging procedure of the battery device 120 and providing power to the battery device 120 during a charging procedure of the battery device 120.

The power source in the charging procedure of the battery device 120 may be the external DC (direct current)/AC (alternating current) power source 50.

The power selection device 113 selects the power source provided for the host power 114. For example, when the power selection device 113 detects that an adaptor is plugged into a socket (not shown in FIG. 1) of the electronic device 100, the power selection device 113 selects the external DC/AC power source 50 as the power source to provide power to the host power 114. On the other hand, when the power selection device 113 does not detect any adaptor plugged into the socket of the electronic device 100, the power selection device 113 selects the battery device 120 as the power source to provide power to the host power 114.

The host power 114 is configured to provide power required by the electronic device 100 during operations. The power management device 115 is coupled to the host power 114 for managing the power of the electronic device 100.

The micro-processor 111 is coupled to the charging-discharging chip 112, the power management device 115 and the display device 116 for controlling operations of those devices.

Generally, there are some fundamental protection mechanisms built into the system of the battery device or the host device, to protect the battery device or the host device when the voltage, current, or temperature is too high or too low during the charging/discharging procedure and avoid unnecessary power consumption and the danger caused by undesired heat accumulation to occur. However, in the conventional design, there is no protection mechanism designed for a situation wherein the battery capacity (or the remaining capacity) is abnormally increased or decreased.

According to an embodiment of the invention, the micro-processor 111 or battery device 120 may keep detecting whether a charging abnormality of the battery device 120 has occurred. In the embodiment of the invention, the charging abnormality may comprise abnormalities caused by any kind of problem wherein the capacity (or the remaining capacity) of the battery device 120 is not increasing while in a charging state or during a charging procedure. According to the embodiments of the invention, the problems that cause charging abnormalities may comprise: device damage, improper charging control, communications failure between the battery device and the host device, identification pin abnormally opens, charging protection mechanism fails, . . . etc.

When the micro-processor 111 or the battery device 120 detects that a charging abnormality of the battery device 120 has occurred, the micro-processor 111 or the battery device 120 activates another protection mechanism, called a Keeping Capacity Protection (KCP) mechanism, to make the battery device 120 exit the charging state and avoid unnecessary power consumption and the danger caused by undesired heat accumulation to occur.

In the embodiment of the invention, the KCP mechanism may be implemented at the host device 110 side and/or the battery device 120 side. In addition, detection of the charging abnormality may also be performed at the host device 110 side and/or the battery device 120 side.

According to an embodiment of the invention, the micro-processor 111 communicates with the battery device 120 via a bus. The bus may be a System Management (SM) Bus, for example. The micro-processor 111 may periodically poll the data transmitted on the bus to obtain the parameters corresponding to the current status of the battery device 120. As an example, the battery device 120 may periodically transmit information regarding the detected battery voltage, charging/discharging current, battery temperature, fully-charged capacity, remaining capacity, warning indication, or others to the micro-processor 111 via the bus. In addition, the battery device 120 may also determine the current status of the battery device based on values of the detected voltage, current, temperature and remaining capacity, set the corresponding status flags thereof, and transmit the information regarding the status flag to the micro-processor 111 via the bus.

The micro-processor 111 may determine whether the remaining capacity of the battery device 120 is not increasing while in a charging state according to the remaining capacity or the status flag. For example, when the micro-processor 111 finds that the remaining capacity obtained in successive times of polling does not increase, or a charging abnormal flag of the battery device 120 has already been set, the micro-processor 111 may activate the KCP protection mechanism to make the battery device 120 exit the charging state.

According to an embodiment of the invention, when the micro-processor 111 activates the KCP protection mechanism, the micro-processor 111 may control the charging-discharging chip 112 to stop providing power to the battery device 120 to make the battery device 120 exit the charging state.

According to another embodiment of the invention, when the micro-processor 111 activates the KCP protection mechanism, the micro-processor 111 may also notify the battery device 120 to activate a corresponding protection mechanism via the bus, to stop receiving power from the host device 110 and make the battery device 120 exit the charging state.

In addition, according to an embodiment of the invention, when the micro-processor 111 activates the KCP mechanism, the micro-processor 111 may also control the display device 116 to display a charging abnormal warning message, so as to notify the user of the need to make the battery device 120 exit the charging state.

When the user sees the charging abnormal warning message, the user may check whether there is any problem causing the charging abnormality, such as the device being damaged, the line being dropped, or others. When finding a problem, the user may repair or fix it. When the problem is solved, the user can lift or stop the KCP mechanism. According to an embodiment of the invention, the way to lift or stop the KCP mechanism may comprise, but is not limited to, unplugging and then plugging in the battery device, unplugging and then plugging in the adaptor, touching (for example, a long press) the power key for a predetermined time or touching any predetermined hot key to lift or stop the KCP mechanism, or operating the battery device 120 in a discharging state.

Figure 2:
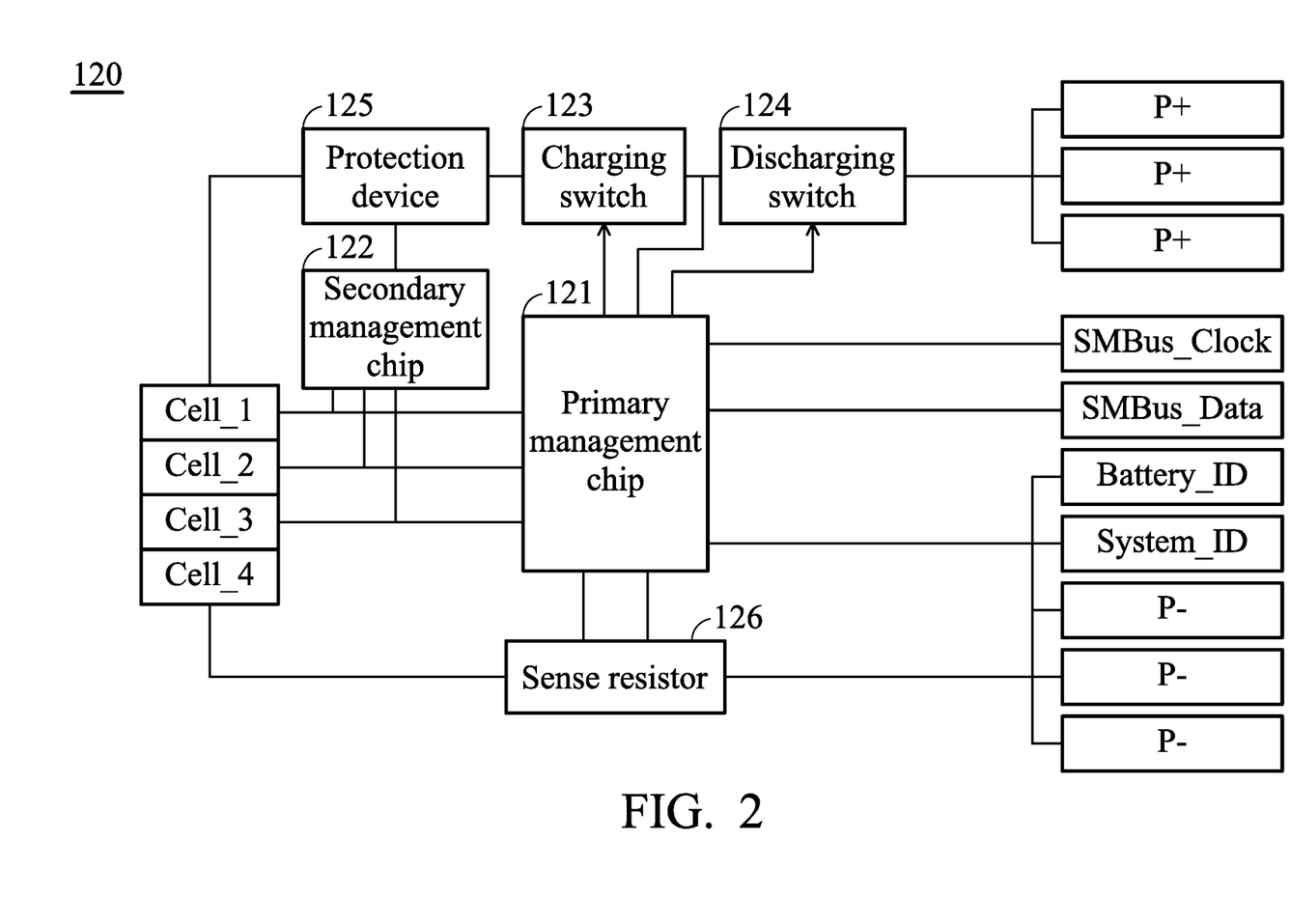
FIG. 2 is a block diagram of a battery device according to an embodiment of the invention.

FIG. 2 is a block diagram of a battery device according to an embodiment of the invention. The battery device 120 may comprise one or more battery cells, such as battery cells Cell_1, Cell_2, Cell_3 and Cell_4 as shown, a primary management chip 121, a secondary management chip 122, a charging switch 123, a discharging switch 124, a protection device 125 and a sense resistor 126.

Note that, in order to clarify the concept of the invention, FIG. 2 presents a simplified block diagram, in which only the elements relevant to the invention are shown. It will be readily appreciated by persons with ordinary skill in the art that the battery device can certainly comprise other elements to provide specific functions, and thus the invention is not limited to what is shown in FIG. 2.

The charging switch 123 and the discharging switch 124 may be coupled between the positive terminals P+ of the battery device 120 and the battery cell via the power line. The primary management chip 121 may control the on or off of the charging switch 123 and the discharging switch 124, so as to control the charging and discharging operations of the battery device 120. For example, when the primary management chip 121 switches on the charging switch 123, the power line is connected between the positive terminals P+ and the battery cell so that the received power can be transmitted to and stored in the battery cell via the power line. When the primary management chip 121 switches off the charging switch 123, a path between the power line and the battery cell is opened, so that the battery cell is disconnected from the positive terminals P+ of the battery device 120. The control of the discharging switch 124 is similar to that of the charging switch 123. According to an embodiment of the invention, the charging switch 123 and the discharging switch 124 may be implemented by transistors.

Besides the charging switch 123 and the discharging switch 124, the protection device 125 may also be coupled between the positive terminals P+ of the battery device 120 and the battery cell via the power line as a secondary defense line. For example, when the control of the charging switch 123 or the discharging switch 124 fails, the secondary management chip 122 may control the protection device 125 to cut the connection between the power line and the battery cell. According to an embodiment of the invention, the protection device 125 may be implemented by a fuse.

The sense resistor 126 may be coupled between the negative terminals P− of the battery device 120 and battery cell via the power line for detecting the amount of charging/discharging current of the battery device 120. The primary management chip 121 is coupled to the internal elements of the battery device for detecting the voltage, charging/discharging current, temperature, remaining capacity, or other parameters of the battery device 120, and manage the operation state of the battery device 120 according to the detected parameters. The primary management chip 121 is further coupled to the bus, such as the clock pin SMBus_Clock and the data pin SMBus_Data of the SM bus, and communicates with the host device 110 via the bus.

In addition, the primary management chip 121 is further coupled to the identification pins, such as the identification pins Battery_ID and System_ID as shown. The identification pin Battery_ID is provided for the host device 110 to identify the battery device 120, and the identification pin System_ID is provided for the battery device 120 to identify the host device 110.

According to an embodiment of the invention, the primary management chip 121 may continue detecting whether the charging abnormality has occurred when the battery device 120 operates in the charging state. For example, when the primary management chip 121 detects that the remaining capacity obtained in successive polling or calculation does not increase, the primary management chip 121 may activate the KCP mechanism to make the battery device 120 exit the charging state.

According to an embodiment of the invention, when the primary management chip 121 activates the KCP mechanism, the primary management chip 121 may request, via the bus, the host device 110 that provides power to the battery device 120 in the charging state to stop providing the power, so as to make the battery device 120 exit the charging state.

According to another embodiment of the invention, when the primary management chip 121 activates the KCP mechanism, the primary management chip 121 may also switch off the charging switch 123 to open a path between the power line and the battery cell. The battery device 120 stops receiving power from the host device 110 and then exits the charging state.

In addition, according to an embodiment of the invention, when the primary management chip 121 activates the KCP mechanism, the primary management chip 121 may set a charging abnormal flag to notify the host device 110 of the charging abnormality. When the micro-processor 111 of the host device 110 detects that the battery device 120 sets the charging abnormal flag, the micro-processor 111 may control the display device 116 to display a charging abnormal warning message, so as to notify the user of the need to make the battery device 120 exit the charging state. In addition, the micro-processor 111 also activates the corresponding KCP mechanism at the host device 110 side as discussed-above to make the battery device 120 exit the charging state.

When the user sees the charging abnormal warning message, the user may check whether any problem is causing the charging abnormality, such as the device being damaged, the line being dropped, or others. Upon finding the problem, the user may repair or fix it. When the problem is solved, the user can lift or stop the KCP mechanism and the charging abnormal flag will be reset accordingly. According to an embodiment of the invention, the way to lift or stop the KCP mechanism may comprise, but is not limited to, unplugging and then plugging in the battery device, unplugging and then plugging in the adaptor, touching (for example, a long press) the power key for a predetermined time or touching any predetermined hot key to lift or stop the KCP mechanism, or making the battery device 120 operate in a discharging state.

Figure 3:
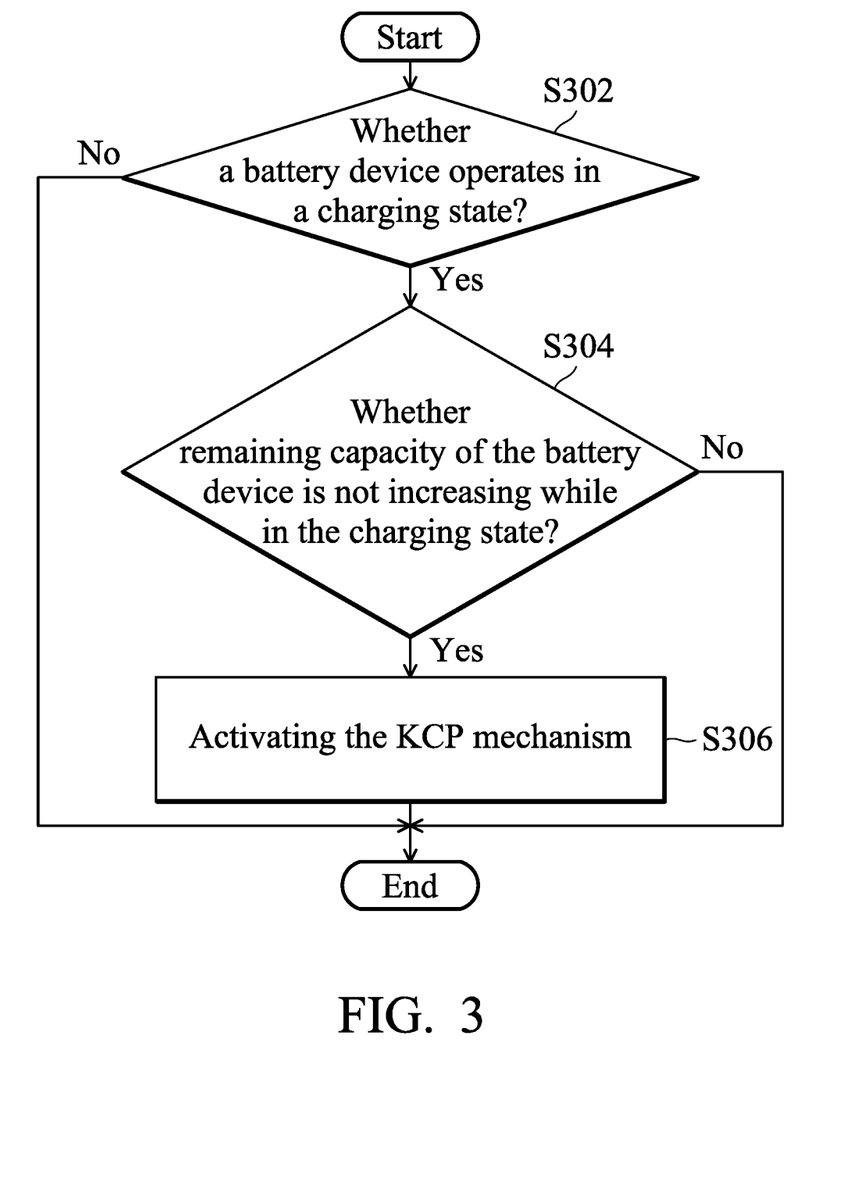
FIG. 3 shows the flow chart of a method for protecting a battery device according to an embodiment of the invention.

FIG. 3 shows the flow chart of a method for protecting a battery device according to an embodiment of the invention. The flow chart shown in FIG. 3 is described from the perspective of the electronic device system comprising the battery device and the host device. First of all, whether a battery device operates in a charging state is determined (Step S302). If not, there is no need to activate the KCP mechanism. If so, whether the remaining capacity of the battery device is not increasing while in the charging state is determined (Step S304). If not, there is no need to activate the KCP mechanism. If so, the KCP mechanism is activated (Step S306) to make the battery device exit the charging state.

Figure 4A:
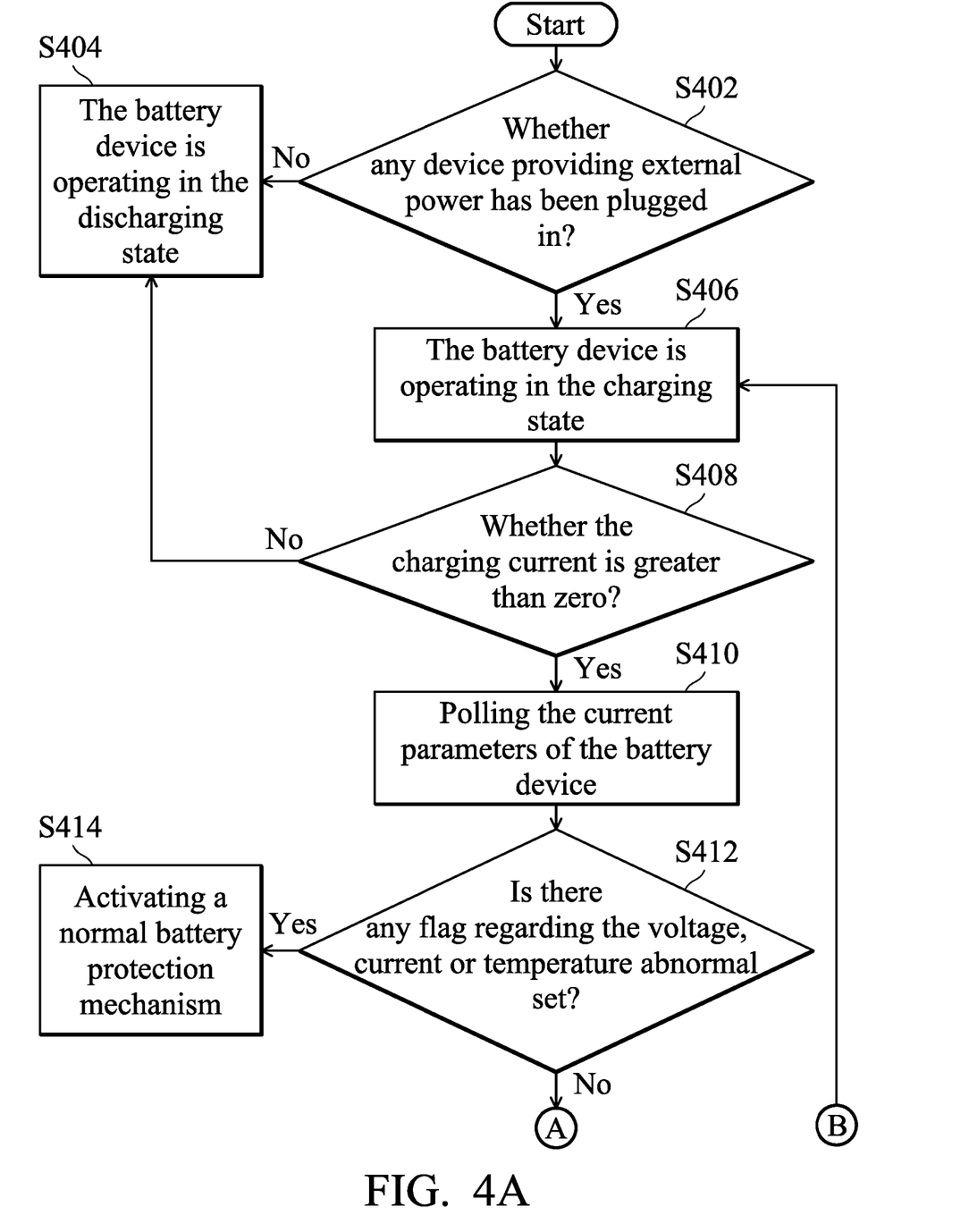
FIG. 4A and FIG. 4B show the flow chart of a method for protecting a battery device according to an embodiment of the invention.
Figure 4B:
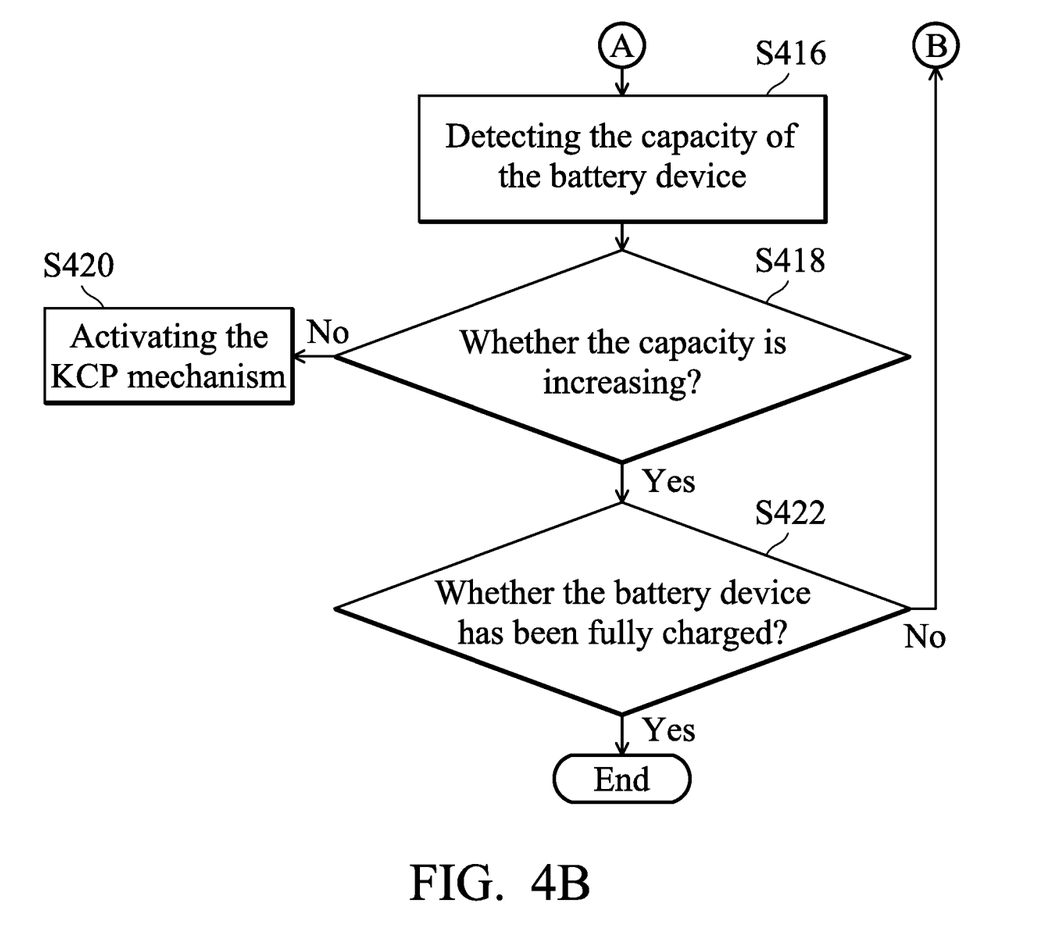

FIG. 4A and FIG. 4B show the flow chart of a method for protecting a battery device according to an embodiment of the invention. The flow chart shown in FIG. 4A and FIG. 4B show is described from the perspective of the host device, where the host device may be coupled to the battery device as shown in FIG. 1. First of all, the host device determines whether any device providing external power has been plugged in (Step S402). If not, the battery is determined to be operating in the discharging state (Step S404). If so, the battery is determined to be operating in the charging state (Step S406).

Next, the host device determines whether the charging current is greater than zero (Step S408). For example, determining whether the charging current provided by the charging-discharging chip 112 is greater than zero. If the charging current is not greater than zero, the battery device is determined to be operating in the discharging state (Step S404). If the charging current is greater than zero, the host device may further poll the current parameters of the battery device (Step S410). For example, the host device may poll the data transmitted on the bus to know the current state and the parameters of the battery device.

Next, the host device determines whether there is any flag regarding the voltage, current or temperature abnormal set (Step S412). If so, the host device activates a normal battery protection mechanism (Step S414). If not, the host device further detects the capacity of the battery device (Step S416) and determines whether the capacity is increasing (Step S418). For example, the host device may check the values of the corresponding parameters related to the battery capacity to determine whether the battery capacity is increasing while in the charging state. In addition, the host device may further check the values of the corresponding parameters related to the battery voltage/current, determine whether the battery voltage is increasing or the battery current is 0 amp to determine whether the battery capacity is increasing while in the charging state.

If not, the KCP mechanism discussed above is activated (Step S420). If so, the host device further determines whether the battery device has been fully charged and is in a fully-charged state (Step S422). If so, the charging procedure is completed. If not, the procedure returns to step S406 to keep monitoring the status of the battery device.

Figure 5A:
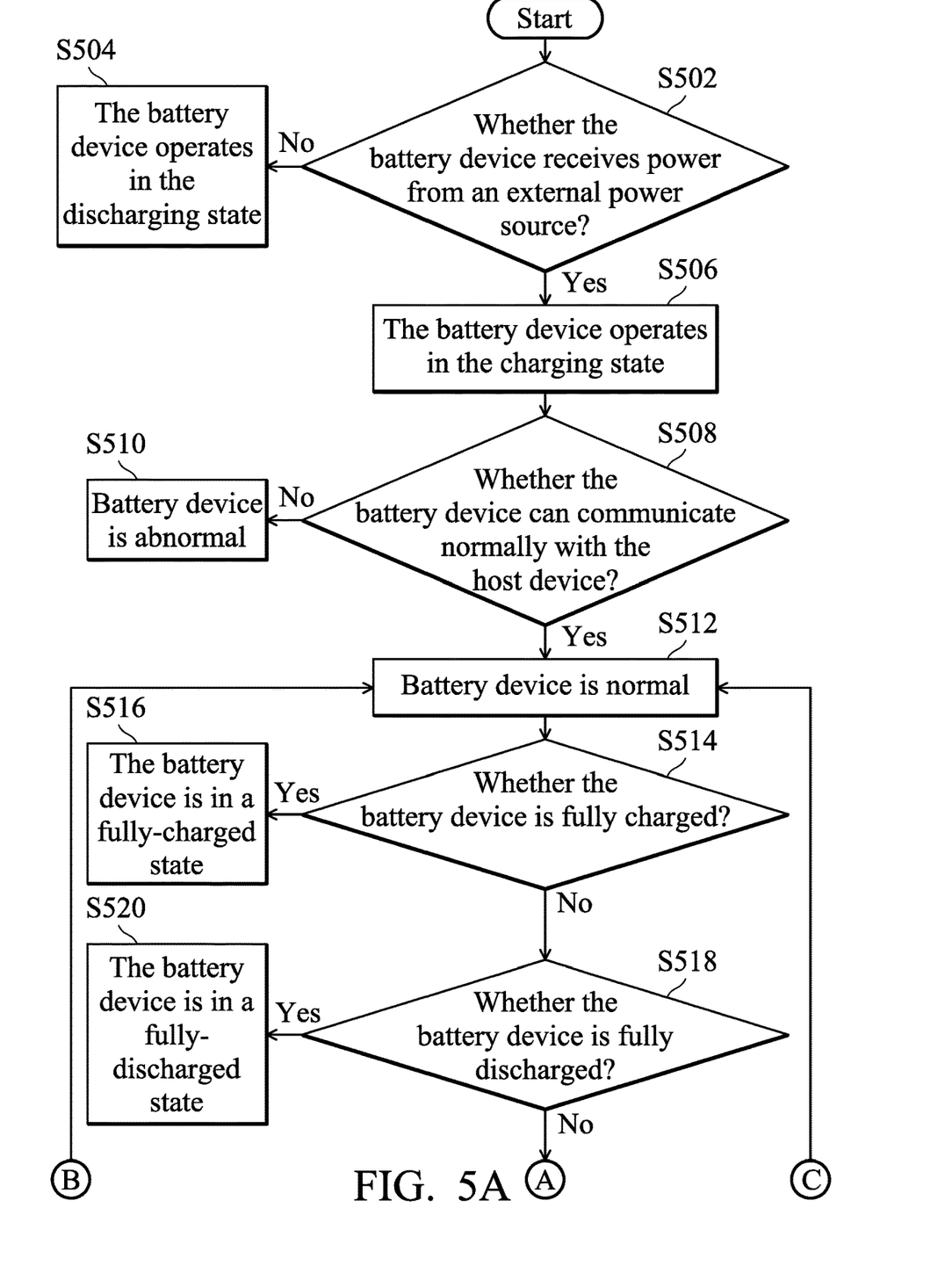
FIG. 5A and FIG. 5B show the flow chart of a method for protecting a battery device according to an embodiment of the invention.
Figure 5B:
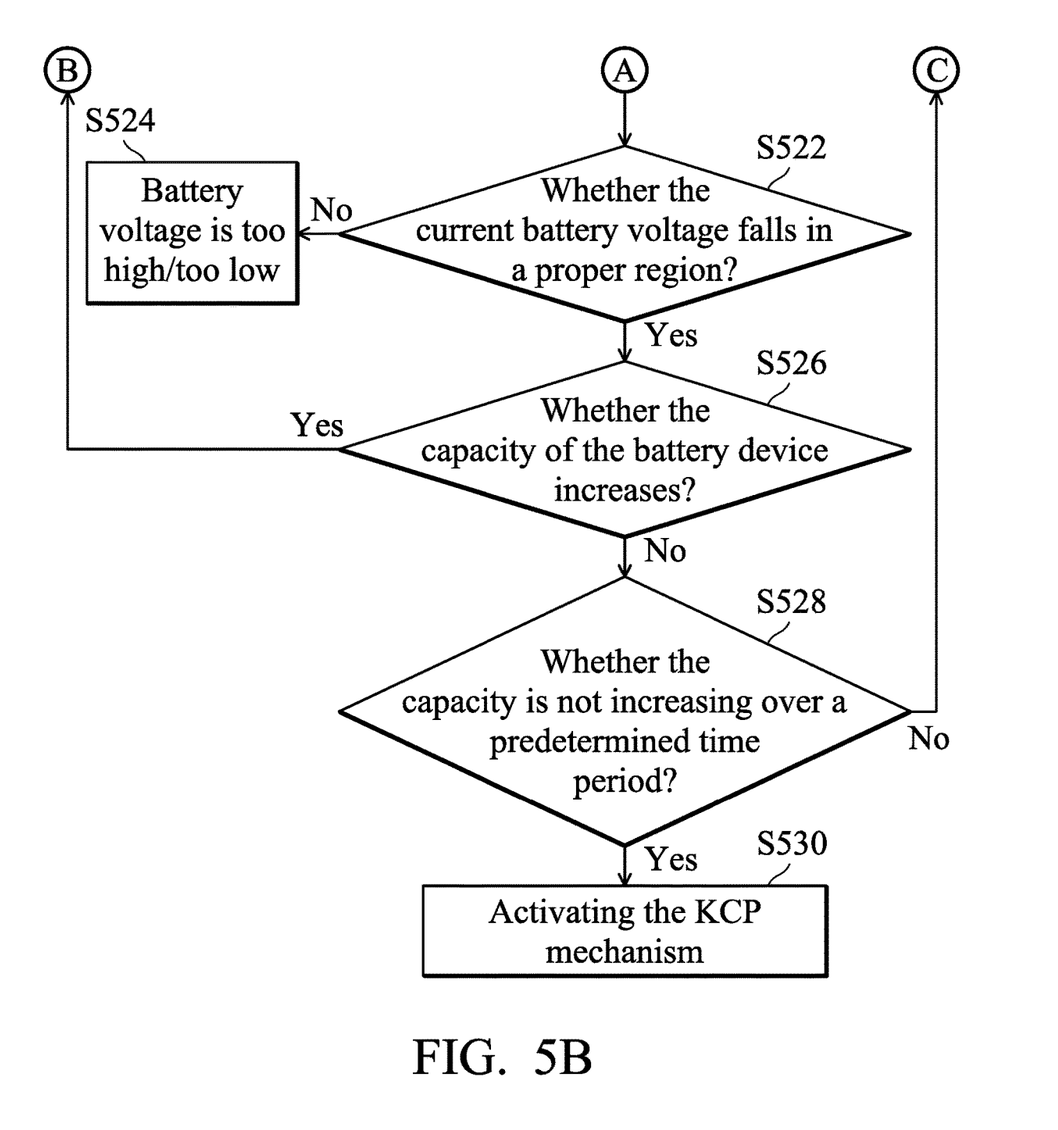

FIG. 5A and FIG. 5B show the flow chart of a method for protecting a battery device according to an embodiment of the invention. The flow chart shown in FIG. 5A and FIG. 5B is described from the perspective of the battery device. First of all, the primary management chip 121 determines whether the battery device receives power from an external power source (Step S502). If not, the battery device currently operates in the discharging state (Step S504). If so, the battery device currently operates in the charging state (Step S506).

Next, the primary management chip 121 determines whether the battery device can communicate normally with the host device (Step S508). If not, the battery device is determined to be abnormal (Step S510). If so, the battery device is determined to be normal (Step S512).

Next, the primary management chip 121 determines whether the battery device is fully charged (Step S514). As an example, a fully-charged region can be defined as 95%-100% of a fully-charged capacity (or, the highest capacity of the battery device). If the primary management chip 121 determines that the current capacity of the battery device falls in the fully-charged region, it is determined that the battery device is fully charged and entering a fully-charged state (Step S516). In this manner, the KCP mechanism is not activated.

If not, the primary management chip 121 further determines whether the battery device is fully discharged (Step S518). As an example, a fully-discharged region can be defined as 0%-10% of a fully-charged capacity (or, the highest capacity of the battery device). If the primary management chip 121 determines that the current capacity of the battery device falls in the fully-discharged region, it is determined that the battery device is fully discharged and enters a fully-discharged state (Step S520). In this manner, the KCP mechanism is not activated.

Note that there may be some protection mechanisms designed for the fully-charged and the fully-discharged states.

When the battery device is not fully discharged, the primary management chip 121 further determines whether the current battery voltage falls in a proper voltage region (Step S522). For example, the proper voltage region may be defined as being between voltages V1 and V2 according to the standards of the battery device. If not, the primary management chip 121 determines that the voltage of the battery device is too high or too low (Step S524). Note that there may be some protection mechanisms designed for the too high or too low voltage conditions.

When the current battery voltage falls into the proper voltage region, the primary management chip 121 further determines whether the battery capacity increases (Step S526). As an example, the primary management chip 121 may determine whether the battery capacity increases or not by detecting or calculating the current battery capacity. In addition, the primary management chip 121 may also determine whether the battery capacity increases or not by detecting or calculating the voltage/current of the battery device and determining whether the battery voltage increases or whether the battery current is 0 amp.

If so, the procedure returns to step S512 to keep monitoring the status of the battery device. If not, the primary management chip 121 further determines whether the capacity is not increasing over a predetermined time period (Step S528). If not, the procedure returns to step S512 to keep monitoring the status of the battery device. If so, the KCP mechanism discussed above is activated (Step S530).

According to an embodiment of the invention, the predetermined time period in step S528 may be designed as a reasonable time period. For example, the length of the predetermined time period may be designed as several seconds or several minutes based on the operation speed of the system. When the capacity is not increasing over the reasonable time period, it means that a charging abnormality has occurred and the KCP mechanism discussed above should be activated.

As discussed above, there is no protection mechanism designed for the battery capacity (or the remaining capacity) being abnormally increased/decreased in the conventional design. In the embodiment of the invention, the microprocessor 111 or the primary management chip 121 of the battery device 120 may keep monitoring whether the battery capacity (or, the remaining capacity) of the battery device does not normally increase in the charging state to cause a charging abnormality.

When a charging abnormality of the battery device 120 is detected, the KCP mechanism discussed above may be activated to make the battery device 120 exit the charging state and notify the user of the charging abnormality condition, so as to avoid unnecessary power consumption and the danger caused by undesired heat accumulation to occur.

In addition, the KCP mechanism discussed above may co-exist with conventional protection mechanisms. For example, the KCP mechanism may be designed as a first line of defense which may be activated prior to the conventional protection mechanisms. In addition, the KCP mechanism may also be designed as a second line of defense after the conventional protection mechanism has been activated, to keep detecting whether a charging abnormality has occurred due to the conventional protection mechanism failing. In addition, as shown in the exemplary flow charts in FIG. 4A and FIG. 4B, and FIG. 5A and FIG. 5B, detection of a capacity abnormality that will trigger the KCP mechanism can be performed collaterally with detection of abnormal events that will trigger the conventional protection mechanisms.

The embodiments of the present invention can be implemented in any of numerous ways. For example, the embodiments may be implemented using hardware, software or a combination thereof. It should be appreciated that any component or collection of components that perform the functions described above can be generically considered as one or more processors that control the function discussed above. The one or more processors can be implemented in numerous ways, such as with dedicated hardware, or with general-purpose hardware that is programmed using microcode or software to perform the functions recited above.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A battery device, comprising:
   at least a battery cell;
   a management chip, coupled to the battery cell for detecting a voltage or remaining capacity of the battery cell and managing an operation state of the battery device according to the voltage or the remaining capacity of the battery cell; and
   a bus, coupled to the management chip, wherein the management chip communicates with a host device via the bus, and
   wherein the management chip further determines whether the battery cell operates in a charging state; when the management chip determines that the battery cell operates in the charging state, the management chip determines whether the battery cell is fully charged; when the management chip determines that the battery cell is fully charged, the management chip does not activate a protection mechanism; when the management chip determines that the battery cell is not fully charged, the management chip determines whether the remaining capacity of the battery cell is not increasing by detecting or calculating a current of the battery device and determining whether the current is 0 amp; and when the management chip determines that the remaining capacity of the battery cell is not increasing, the management chip activates the protection mechanism to make the battery device exit the charging state.

2. The battery device as claimed in claim 1, wherein when the management chip activates the protection mechanism, the management chip requests, via the bus, the host device, which provides power to the battery device in the charging state, to stop providing the power.

3. The battery device as claimed in claim 1, further comprising:
   a charging switch, coupled between a power line for transmitting power and the battery cell,
   wherein when the management chip activates the protection mechanism, the management chip switches off the charging switch to open a path between the power line and the battery cell.

4. An electronic device, comprising:
   a battery device;
   a charging-discharging chip, coupled to the battery device for controlling a charging operation and a discharging operation of the battery device; and
   a micro-processor, communicating with the battery device via a bus,
   wherein the micro-processor determines whether the battery device operates in a charging state; when the micro-processor determines that the battery device operates in the charging state, the micro-processor determines whether the battery device is fully charged; when the micro-processor determines that the battery device is fully charged, the micro-processor does not activate a protection mechanism; when the micro-processor determines that the battery device is not fully charged, the micro-processor determines whether remaining capacity of the battery device is not increasing by determining whether a current of the battery device is 0 amp; and when the micro-processor determines that the remaining capacity of the battery device is not increasing, the micro-processor activates the protection mechanism to make the battery device exit the charging state.

5. The electronic device as claimed in claim 4, wherein when the micro-processor activates the protection mechanism, the micro-processor controls the charging-discharging chip to stop providing power to the battery device.

6. The electronic device as claimed in claim 4, further comprising:
   a display device,
   wherein when the micro-processor activates the protection mechanism, the micro-processor controls the display device to display a charging abnormal warning message.

7. A method for protecting a battery device, comprising:
   determining whether a battery device operates in a charging state;
   when determining that the battery device operates in the charging state, determining whether the battery device is fully charged;
   when determining that the battery device is fully charged, not activating a protection mechanism;
   when determining that the battery device is not fully charged, determining whether remaining capacity of the battery device is not increasing by detecting or calculating a current of the battery device and determining whether the current is 0 amp; and
   when determining that the remaining capacity of the battery device is not increasing-, activating the protection mechanism to make the battery device exit the charging state.

8. The method as claimed in claim 7, further comprising:
   controlling a host device to stop providing power to the battery device when activating the protection mechanism.

9. The method as claimed in claim 7, further comprising:
   controlling the battery device to stop receiving power from a host device when activating the protection mechanism.

10. The method as claimed in claim 7, further comprising:
    controlling a display device to display a charging abnormal warning message when activating the protection mechanism.

* * * * *